United States Patent [19]

Hirayama et al.

[11] Patent Number: 5,729,224
[45] Date of Patent: Mar. 17, 1998

[54] CODE CONVERSION AND DEMODULATION APPARATUS, A METHOD THEREOF, AND A RECORDING MEDIUM

[75] Inventors: Koichi Hirayama; Yoshiyuki Ishizawa, both of Yokohama; Shinichi Tanaka, Kyoto; Toshiyuki Shimada, Kobe, all of Japan

[73] Assignee: Kabushiki Kaisha Toshiba, Kanagawa-ken, Japan

[21] Appl. No.: 629,941

[22] Filed: Apr. 12, 1996

[30] Foreign Application Priority Data

Apr. 12, 1995 [JP] Japan ............. 7-086873

[51] Int. Cl.⁶ ............................................... H03M 7/00
[52] U.S. Cl. ......................... 341/59; 341/58; 341/61
[58] Field of Search .......................... 341/58, 51, 50, 341/59, 61, 106

[56] References Cited

U.S. PATENT DOCUMENTS

| | | |
|---|---|---|
| 4,323,931 | 4/1982 | Jacoby . |
| 4,644,546 | 2/1987 | Doi et al. ........................ 371/49 |
| 4,728,929 | 3/1988 | Tanaka . |
| 5,196,848 | 3/1993 | Sakazaki ........................ 341/58 |
| 5,206,646 | 4/1993 | Sako et al. ...................... 341/95 |
| 5,355,133 | 10/1994 | Shimpuku et al. ............. 341/58 |
| 5,375,249 | 12/1994 | Cho ............................... 395/800 |
| 5,469,162 | 11/1995 | Chaki et al. .................... 341/58 |
| 5,508,701 | 4/1996 | Nose et al. ..................... 341/58 |

OTHER PUBLICATIONS

Franaszek, "Sequence-state Methods for Run-length-limited Coding", IBM J. Res. Develop., Jul. 1970, pp. 376–383.

Primary Examiner—Jeffrey A. Gaffin
Assistant Examiner—Jason L. W. Kost
Attorney, Agent, or Firm—Cushman, Darby & Cushman IP Group of Pillsbury, Madison & Sutro LLP

[57] ABSTRACT

Source data each consisting of m-bits can be converted into conversion codes each consisting of n (>m) bits with ease, and reverse conversion thereof can be performed with ease. The code conversion and the reverse conversion can be characterized in terms of a series of tables.

The current input source data and the next input source data are respectively taken in by registers. Whether or not the run length at a connecting portion between consecutive source data satisfies conditions is determined by a control unit, and a table to be used is selected to finally obtain a conversion code.

13 Claims, 16 Drawing Sheets

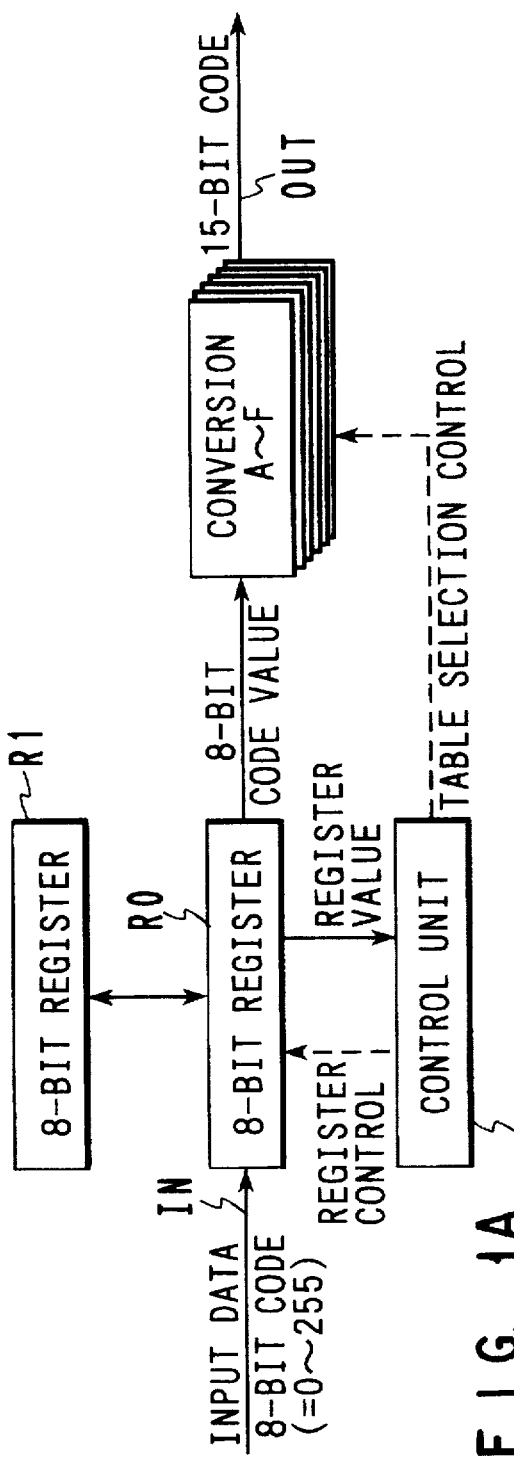
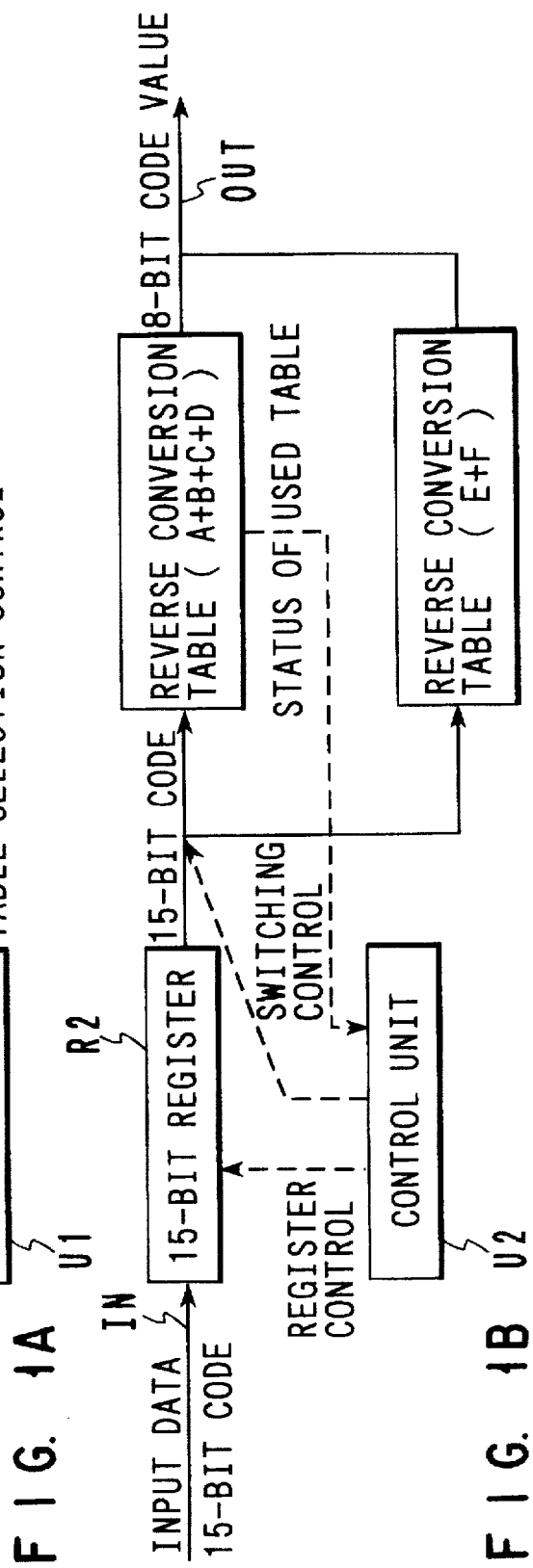
F I G. 1A
F I G. 1B

| C1 group | | | | | | C2 group | | | | |
|---|---|---|---|---|---|---|---|---|---|---|
| 0 | 1 | | | | | 0 | 2 | 7 | 8 | 11 |
| | | | | | | 12 | 16 | 17 | 19 | 24 |
| | | | | | | 25 | 27 | 30 | 33 | 36 |
| | | | | | | 49 | 50 | 54 | 55 | 57 |
| | | | | | | 60 | 63 | 64 | 67 | 68 |
| | | | | | | 70 | 73 | 74 | 76 | 81 |
| | | | | | | 82 | 84 | 87 | 90 | 91 |
| | | | | | | 94 | 95 | 97 | 100 | 101 |
| | | | | | | 103 | 108 | 109 | 111 | 114 |
| | | | | | | 117 | 120 | 121 | 123 | 126 |
| | | | | | | 129 | 130 | 133 | 134 | 136 |
| | | | | | | 139 | 140 | 142 | 147 | 148 |
| | | | | | | 150 | 153 | 156 | 159 | 160 |
| | | | | | | 162 | 165 | 168 | 169 | 172 |
| | | | | | | 173 | 176 | 177 | 179 | 182 |
| | | | | | | 185 | 186 | 189 | 190 | 194 |
| | | | | | | 195 | 197 | 202 | 203 | 205 |
| | | | | | | 208 | 211 | 214 | 215 | 217 |
| | | | | | | 220 | 223 | 224 | 227 | 228 |
| | | | | | | 232 | 233 | 235 | 238 | 241 |
| | | | | | | 242 | 245 | 246 | 250 | 251 |
| | | | | | | 253 | | | | |
| 2 | 3 | 4 | | | | 0 | 2 | 8 | 12 | 17 |
| | | | | | | 19 | 25 | 27 | 30 | 37 |
| | | | | | | 39 | 42 | 46 | 50 | 55 |
| | | | | | | 57 | 60 | 64 | 68 | 70 |
| | | | | | | 74 | 76 | 82 | 84 | 87 |
| | | | | | | 91 | 95 | 97 | 101 | 103 |
| | | | | | | 109 | 111 | 114 | 121 | 123 |
| | | | | | | 126 | 130 | 134 | 136 | 140 |
| | | | | | | 142 | 148 | 150 | 153 | 160 |
| | | | | | | 162 | 165 | 169 | 173 | 177 |
| | | | | | | 179 | 182 | 186 | 190 | 195 |
| | | | | | | 197 | 203 | 205 | 208 | 215 |
| | | | | | | 217 | 220 | 224 | 228 | 233 |
| | | | | | | 235 | 238 | 242 | 246 | 251 |
| | | | | | | 253 | | | | |
| 5 | 6 | 7 | | | | 2 | 8 | 19 | 27 | 30 |
| | | | | | | 39 | 42 | 46 | 57 | 60 |
| | | | | | | 64 | 70 | 76 | 84 | 87 |
| | | | | | | 91 | 97 | 103 | 111 | 114 |
| | | | | | | 123 | 126 | 130 | 136 | 142 |
| | | | | | | 150 | 153 | 162 | 165 | 169 |
| | | | | | | 179 | 182 | 186 | 197 | 205 |
| | | | | | | 208 | 217 | 220 | 224 | 235 |
| | | | | | | 238 | 242 | 253 | | |
| 8 | 9 | 10 | 11 | 12 | 13 | 8 | 30 | 42 | 46 | 60 |
| | | | | | | 64 | 70 | 87 | 91 | 97 |
| | | | | | | 114 | 126 | 130 | 136 | 153 |
| | | | | | | 165 | 169 | 182 | 186 | 208 |
| | | | | | | 220 | 224 | 238 | 242 | |
| 14 | 15 | 16 | 17 | 18 | 19 | 8 | 46 | 64 | 70 | 91 |
| 20 | 21 | | | | | 97 | 130 | 136 | 169 | 186 |
| | | | | | | 224 | 242 | | | |
| 22 | 23 | 24 | 25 | 26 | 27 | 70 | 97 | 136 | | |
| 28 | 29 | 30 | 31 | 32 | 33 | | | | | |

FIG. 5

| C3 group | C2 group | | | | |
|---|---|---|---|---|---|
| 13 | 0 | 2 | 7 | 8 | 11 |
| | 12 | 16 | 17 | 19 | 24 |
| | 25 | 27 | 30 | 33 | 36 |
| | 49 | 50 | 54 | 55 | 57 |
| | 60 | 63 | 64 | 67 | 68 |
| | 70 | 73 | 74 | 76 | 81 |
| | 82 | 84 | 87 | 90 | 91 |
| | 94 | 95 | 97 | 100 | 101 |
| | 103 | 108 | 109 | 111 | 114 |
| | 117 | 120 | 121 | 123 | 126 |
| | 129 | 130 | 133 | 134 | 136 |
| | 139 | 140 | 142 | 147 | 148 |
| | 150 | 153 | 156 | 159 | 160 |
| | 162 | 165 | 168 | 169 | 172 |
| | 173 | 176 | 177 | 179 | 182 |
| | 185 | 186 | 189 | 190 | 194 |
| | 195 | 197 | 202 | 203 | 205 |
| | 208 | 211 | 214 | 215 | 217 |
| | 220 | 223 | 224 | 227 | 228 |
| | 232 | 233 | 235 | 238 | 241 |
| | 242 | 245 | 246 | 250 | 251 |
| | 253 | | | | |
| 20 | 0 | 2 | 8 | 12 | 17 |
| | 19 | 25 | 27 | 30 | 37 |
| | 39 | 42 | 46 | 50 | 55 |
| | 57 | 60 | 64 | 68 | 70 |
| | 74 | 76 | 82 | 84 | 87 |
| | 91 | 95 | 97 | 101 | 103 |
| | 109 | 111 | 114 | 121 | 123 |
| | 126 | 130 | 134 | 136 | 140 |
| | 142 | 148 | 150 | 153 | 160 |
| | 162 | 165 | 169 | 173 | 177 |
| | 179 | 182 | 186 | 190 | 195 |
| | 197 | 203 | 205 | 208 | 215 |
| | 217 | 220 | 224 | 228 | 233 |
| | 235 | 238 | 242 | 246 | 251 |
| | 253 | | | | |
| 31 178 | 2 | 8 | 19 | 27 | 30 |
| | 39 | 42 | 46 | 57 | 60 |
| | 64 | 70 | 76 | 84 | 87 |
| | 91 | 97 | 103 | 111 | 114 |
| | 123 | 126 | 130 | 136 | 142 |
| | 150 | 153 | 162 | 165 | 169 |
| | 179 | 182 | 186 | 197 | 205 |
| | 208 | 217 | 220 | 224 | 235 |
| | 238 | 242 | 253 | | |
| 1 47 180 | 8 | 30 | 42 | 46 | 60 |
| | 64 | 70 | 87 | 91 | 97 |
| | 114 | 126 | 130 | 136 | 153 |
| | 165 | 169 | 182 | 186 | 208 |
| | 220 | 224 | 238 | 242 | |
| 3 71 75 183 | 8 | 46 | 64 | 70 | 91 |
| | 97 | 130 | 136 | 169 | 186 |
| | 224 | 242 | | | |
| 5 106 110 112 187 191 | 70 | 97 | 136 | | |

FIG. 6

TABLE A (175 Codes)

| Source Code (decimal value) | MSB Conversion Code LSB | Source Code (decimal value) | MSB Conversion Code LSB |
|---|---|---|---|
| 0 | 0001000000000000 | 34 | 1000000000100000 |
| 1 | 1001000000000000 | 35 | 0100000000100000 |
| 2 | 0000100000000000 | 36 | 0010000000100000 |
| 3 | 1000100000000000 | 37 | 0001000000100000 |
| 4 | 0100100000000000 | 38 | 1001000000100000 |
| 5 | 1000010000000000 | 39 | 0000100000100000 |
| 6 | 0100010000000000 | 40 | 1000100000100000 |
| 7 | 0010010000000000 | 41 | 0100100000100000 |
| 8 | 0000001000000000 | 42 | 0000010000100000 |
| 9 | 1000001000000000 | 43 | 1000010000100000 |
| 10 | 0100001000000000 | 44 | 0100010000100000 |
| 11 | 0010001000000000 | 45 | 0010010000100000 |
| 12 | 0001001000000000 | 46 | 0000001000100000 |
| 13 | 1001001000000000 | 47 | 1000001000100000 |
| 14 | 1000000100000000 | 48 | 0100001000100000 |
| 15 | 0100000100000000 | 49 | 0010001000100000 |
| 16 | 0010000100000000 | 50 | 0001001000100000 |
| 17 | 0001000100000000 | 51 | 1001001000100000 |
| 18 | 1001000100000000 | 52 | 1000000000010000 |
| 19 | 0000100100000000 | 53 | 0100000000010000 |
| 20 | 1000100100000000 | 54 | 0010000000010000 |
| 21 | 0100100100000000 | 55 | 0001000000010000 |
| 22 | 1000000010000000 | 56 | 1001000000010000 |
| 23 | 0100000010000000 | 57 | 0000100000010000 |
| 24 | 0010000010000000 | 58 | 1000100000010000 |
| 25 | 0001000010000000 | 59 | 0100100000010000 |
| 26 | 1001000010000000 | 60 | 0000010000010000 |
| 27 | 0000100010000000 | 61 | 1000010000010000 |
| 28 | 1000100010000000 | 62 | 0100010000010000 |
| 29 | 0100100010000000 | 63 | 0010010000010000 |
| 30 | 0000010010000000 | 64 | 0000001000010000 |
| 31 | 1000010010000000 | 65 | 1000001000010000 |
| 32 | 0100010010000000 | 66 | 0100001000010000 |
| 33 | 0010010010000000 | 67 | 0010001000010000 |

FIG. 7A

TABLE A (175 Codes)

| Source Code (decimal value) | MSB Conversion Code LSB | Source Code (decimal value) | MSB Conversion Code LSB |
|---|---|---|---|
| 68 | 0001001000010000 | 102 | 1001000010001000 |
| 69 | 1001001000010000 | 103 | 0000100010001000 |
| 70 | 0000000010010000 | 104 | 1000100010001000 |
| 71 | 1000000010010000 | 105 | 0100100010001000 |
| 72 | 0100000010010000 | 106 | 1000000001001000 |
| 73 | 0010000010010000 | 107 | 0100000001001000 |
| 74 | 0001000010010000 | 108 | 0010000001001000 |
| 75 | 1001000010010000 | 109 | 0001000001001000 |
| 76 | 0000100010010000 | 110 | 1001000001001000 |
| 77 | 1000100010010000 | 111 | 0000100001001000 |
| 78 | 0100100010010000 | 112 | 1000100001001000 |
| 79 | 1000000000001000 | 113 | 0100100001001000 |
| 80 | 0100000000001000 | 114 | 0000010001001000 |
| 81 | 0010000000001000 | 115 | 1000010001001000 |
| 82 | 0001000000001000 | 116 | 0100010001001000 |
| 83 | 1001000000001000 | 117 | 0010010001001000 |
| 84 | 0000100000001000 | 118 | 1000000000000100 |
| 85 | 1000100000001000 | 119 | 0100000000000100 |
| 86 | 0100100000001000 | 120 | 0010000000000100 |
| 87 | 0000010000001000 | 121 | 0001000000000100 |
| 88 | 1000010000001000 | 122 | 1001000000000100 |
| 89 | 0100010000001000 | 123 | 0000100000000100 |
| 90 | 0010010000001000 | 124 | 1000100000000100 |
| 91 | 0000001000001000 | 125 | 0100100000000100 |
| 92 | 1000001000001000 | 126 | 0000010000000100 |
| 93 | 0100001000001000 | 127 | 1000010000000100 |
| 94 | 0010001000001000 | 128 | 0100010000000100 |
| 95 | 0001001000001000 | 129 | 0010010000000100 |
| 96 | 1001001000001000 | 130 | 0000001000000100 |
| 97 | 0000000100001000 | 131 | 1000001000000100 |
| 98 | 1000000100001000 | 132 | 0100001000000100 |
| 99 | 0100000100001000 | 133 | 0010001000000100 |
| 100 | 0010000100001000 | 134 | 0001001000000100 |
| 101 | 0001000100001000 | 135 | 1001001000000100 |

FIG. 7B

TABLE A (175 Codes)

| Source Code (decimal value) | MSB Conversion Code LSB | Source Code (decimal value) | MSB Conversion Code LSB |
|---|---|---|---|
| 136 | 000000010000100 | 170 | 100000100100100 |
| 137 | 100000010000100 | 171 | 010000100100100 |
| 138 | 010000010000100 | 172 | 001000100100100 |
| 139 | 001000010000100 | 173 | 000100100100100 |
| 140 | 000100010000100 | 174 | 100100100100100 |
| 141 | 100100010000100 | | |
| 142 | 000010010000100 | | |
| 143 | 100010010000100 | | |
| 144 | 010010010000100 | | |
| 145 | 100000001000100 | | |
| 146 | 010000001000100 | | |
| 147 | 001000001000100 | | |
| 148 | 000100001000100 | | |
| 149 | 100100001000100 | | |
| 150 | 000010001000100 | | |
| 151 | 100010001000100 | | |
| 152 | 010010001000100 | | |
| 153 | 000001001000100 | | |
| 154 | 100001001000100 | | |
| 155 | 010001001000100 | | |
| 156 | 001001001000100 | | |
| 157 | 100000000100100 | | |
| 158 | 010000000100100 | | |
| 159 | 001000000100100 | | |
| 160 | 000100000100100 | | |
| 161 | 100100000100100 | | |
| 162 | 000010000100100 | | |
| 163 | 100010000100100 | | |
| 164 | 010010000100100 | | |
| 165 | 000001000100100 | | |
| 166 | 100001000100100 | | |
| 167 | 010001000100100 | | |
| 168 | 001001000100100 | | |
| 169 | 000000100100100 | | |

FIG. 7C

TABLE B (81 Codes)

| Source Code (decimal value) | MSB Conversion Code LSB | Source Code (decimal value) | MSB Conversion Code LSB |
|---|---|---|---|
| 175 | 0100000000000010 | 209 | 1000010010000010 |
| 176 | 0010000000000010 | 210 | 0100010010000010 |
| 177 | 0001000000000010 | 211 | 0010010010000010 |
| 178 | 1001000000000010 | 212 | 1000000001000010 |
| 179 | 0000100000000010 | 213 | 0100000001000010 |
| 180 | 1000100000000010 | 214 | 0010000001000010 |
| 181 | 0100100000000010 | 215 | 0001000001000010 |
| 182 | 0000010000000010 | 216 | 1001000001000010 |
| 183 | 1000010000000010 | 217 | 0000100001000010 |
| 184 | 0100010000000010 | 218 | 1000100001000010 |
| 185 | 0010010000000010 | 219 | 0100100001000010 |
| 186 | 0000001000000010 | 220 | 0000010001000010 |
| 187 | 1000001000000010 | 221 | 1000010001000010 |
| 188 | 0100001000000010 | 222 | 0100010001000010 |
| 189 | 0010001000000010 | 223 | 0010010001000010 |
| 190 | 0001001000000010 | 224 | 0000001001000010 |
| 191 | 1001001000000010 | 225 | 1000001001000010 |
| 192 | 1000000100000010 | 226 | 0100001001000010 |
| 193 | 0100000100000010 | 227 | 0010001001000010 |
| 194 | 0010000100000010 | 228 | 0001001001000010 |
| 195 | 0001000100000010 | 229 | 1001001001000010 |
| 196 | 1001000100000010 | 230 | 1000000000010010 |
| 197 | 0000100100000010 | 231 | 0100000000010010 |
| 198 | 1000100100000010 | 232 | 0010000000010010 |
| 199 | 0100100100000010 | 233 | 0001000000010010 |
| 200 | 1000000010000010 | 234 | 1001000000010010 |
| 201 | 0100000010000010 | 235 | 0000100000010010 |
| 202 | 0010000010000010 | 236 | 1000100000010010 |
| 203 | 0001000010000010 | 237 | 0100100000010010 |
| 204 | 1001000010000010 | 238 | 0000010000010010 |
| 205 | 0000100010000010 | 239 | 1000010000010010 |
| 206 | 1000100010000010 | 240 | 0100010000010010 |
| 207 | 0100100010000010 | 241 | 0010010000010010 |
| 208 | 0000010010000010 | 242 | 0000001000010010 |

FIG. 8A

TABLE B (81 Codes)

| Source Code (decimal value) | MSB  Conversion Code  LSB |
|---|---|
| 243 | 100000100010010 |
| 244 | 010000100010010 |
| 245 | 001000100010010 |
| 246 | 000100100010010 |
| 247 | 100100100010010 |
| 248 | 100000010010010 |
| 249 | 010000010010010 |
| 250 | 001000010010010 |
| 251 | 000100010010010 |
| 252 | 100100010010010 |
| 253 | 000010010010010 |
| 254 | 100010010010010 |
| 255 | 010010010010010 |

FIG. 8B

TABLE C (81 Codes)

| Source Code (decimal value) | MSB  Conversion Code  LSB |
|---|---|
| 243 | 100100100010001 |
| 244 | 010000100010001 |
| 245 | 001000100010001 |
| 246 | 000100000010001 |
| 247 | 100000100010001 |
| 248 | 100100010010001 |
| 249 | 010010010010001 |
| 250 | 001000010000001 |
| 251 | 000100010000001 |
| 252 | 100000010010001 |
| 253 | 000010000010001 |
| 254 | 100010000010001 |
| 255 | 010000010010001 |

FIG. 9B

TABLE B (81 Codes)

| Source Code (decimal value) | MSB Conversion Code LSB | Source Code (decimal value) | MSB Conversion Code LSB |
|---|---|---|---|
| 175 | 010010000000001 | 209 | 100001000000001 |
| 176 | 001001000000001 | 210 | 010001000000001 |
| 177 | 000100100000001 | 211 | 001000001000001 |
| 178 | 100100000000001 | 212 | 100100000100001 |
| 179 | 000010010000001 | 213 | 010010000100001 |
| 180 | 100010010000001 | 214 | 001001000100001 |
| 181 | 010000000000001 | 215 | 000100100100001 |
| 182 | 000001001000001 | 216 | 100000000100001 |
| 183 | 100001001000001 | 217 | 000010000100001 |
| 184 | 010001001000001 | 218 | 100010000100001 |
| 185 | 001000000000001 | 219 | 010000000100001 |
| 186 | 000000100100001 | 220 | 000001000100001 |
| 187 | 100100100000001 | 221 | 100001000100001 |
| 188 | 010000100100001 | 222 | 010001000100001 |
| 189 | 001000100100001 | 223 | 001000000100001 |
| 190 | 000100000000001 | 224 | 000000100000001 |
| 191 | 100000100000001 | 225 | 100100100100001 |
| 192 | 100100010000001 | 226 | 010000100000001 |
| 193 | 010010010000001 | 227 | 001000100000001 |
| 194 | 001000010010001 | 228 | 000100000100001 |
| 195 | 000100010010001 | 229 | 100000100100001 |
| 196 | 100000010000001 | 230 | 100100000010001 |
| 197 | 000010000000001 | 231 | 010010000010001 |
| 198 | 100010000000001 | 232 | 001001000010001 |
| 199 | 010000010000001 | 233 | 000100100010001 |
| 200 | 100100001000001 | 234 | 100000000010001 |
| 201 | 010010001000001 | 235 | 000010010010001 |
| 202 | 001001001000001 | 236 | 100010010010001 |
| 203 | 000100001000001 | 237 | 010000000010001 |
| 204 | 100000001000001 | 238 | 000001000010001 |
| 205 | 000010001000001 | 239 | 100001000010001 |
| 206 | 100010001000001 | 240 | 010001000010001 |
| 207 | 010000001000001 | 241 | 001000000010001 |
| 208 | 000001000000001 | 242 | 000000100010001 |

FIG. 9A

TABLE D (34 Codes)

| Source Code (decimal value) | MSB Conversion Code LSB |
|---|---|
| 0 | 0001001000010 01 |
| 1 | 1000000000010 01 |
| 2 | 0000100100010 01 |
| 3 | 1000100100010 01 |
| 4 | 0100000000010 01 |
| 5 | 1000010010010 01 |
| 6 | 0100010010010 01 |
| 7 | 0010000000010 01 |
| 8 | 0000001000010 01 |
| 9 | 1001001000010 01 |
| 10 | 0100001000010 01 |
| 11 | 0010001000010 01 |
| 12 | 0001000000010 01 |
| 13 | 1000001000010 01 |
| 14 | 1001000100010 01 |
| 15 | 0100100100010 01 |
| 16 | 0010000100010 01 |
| 17 | 0001000100010 01 |
| 18 | 1000000100010 01 |
| 19 | 0000100000010 01 |
| 20 | 1000100000010 01 |
| 21 | 0100000100010 01 |
| 22 | 1001000010010 01 |
| 23 | 0100100010010 01 |
| 24 | 0010010010010 01 |
| 25 | 0001000010010 01 |
| 26 | 1000000010010 01 |
| 27 | 0000100010010 01 |
| 28 | 1000100010010 01 |
| 29 | 0100000010010 01 |
| 30 | 0000010000010 01 |
| 31 | 1000010000010 01 |
| 32 | 0100010000010 01 |
| 33 | 0010000010010 01 |

FIG. 10

TABLE E (86 Codes)

| Source Code (decimal value) | MSB Conversion Code LSB | Source Code (decimal value) | MSB Conversion Code LSB |
|---|---|---|---|
| 1 | 0001001000000000 | 102 | 0001000100001000 |
| 3 | 0000100100000000 | 104 | 0000100000001000 |
| 5 | 0000010010000000 | 106 | 0000000001000000 |
| 9 | 0000001000100000 | 110 | 0001000001000000 |
| 13 | 0001000000000000 | 112 | 0000100001000000 |
| 14 | 0000000100010000 | 115 | 0000010000001000 |
| 18 | 0001000100010000 | 118 | 0000000000000100 |
| 20 | 0000100000000000 | 122 | 0001001000000100 |
| 22 | 0000000010010000 | 124 | 0000100100000100 |
| 26 | 0001000010010000 | 127 | 0000010010000100 |
| 28 | 0000100010010000 | 131 | 0000001000100100 |
| 31 | 0000010000000000 | 135 | 0001000000000100 |
| 34 | 0000000000100100 | 137 | 0000000100000100 |
| 38 | 0001001000100000 | 141 | 0001000100000100 |
| 40 | 0000100000100100 | 143 | 0000100000000100 |
| 43 | 0000010000100100 | 145 | 0000000010000100 |
| 47 | 0000001000000000 | 149 | 0001000010000100 |
| 51 | 0001000000100000 | 151 | 0000100010000100 |
| 52 | 0000000000010000 | 154 | 0000010000000100 |
| 56 | 0001001000010000 | 157 | 0000000000100000 |
| 58 | 0000100010010000 | 161 | 0001001000100100 |
| 61 | 0000001000010000 | 163 | 0000100000100000 |
| 65 | 0000000100010000 | 166 | 0000010000100000 |
| 69 | 0001000000010000 | 170 | 0000000100000100 |
| 71 | 0000000010000000 | 174 | 0001000000100100 |
| 75 | 0001000100000000 | 178 | 0010010000000000 |
| 77 | 0000100000010000 | 180 | 0010000100000000 |
| 79 | 0000000000001000 | 183 | 0010000010000000 |
| 83 | 0001001000001000 | 187 | 0010000001000000 |
| 85 | 0000100100001000 | 191 | 0010010010000000 |
| 88 | 0000010010001000 | 192 | 0010000000100000 |
| 92 | 0000001000001000 | 196 | 0010010000100000 |
| 96 | 0001000000001000 | 198 | 0010000100100000 |
| 98 | 0000000010001000 | 200 | 0010000000010000 |

FIG. 11A

TABLE E (86 Codes)

| Source Code (decimal value) | MSB Conversion Code LSB |
|---|---|
| 204 | 001001000010000 |
| 206 | 001000100010000 |
| 209 | 001000010010000 |
| 212 | 001000000001000 |
| 216 | 001001000001000 |
| 218 | 001000100001000 |
| 221 | 001000010001000 |
| 225 | 001000001001000 |
| 229 | 001001001001000 |
| 230 | 001000000000100 |
| 234 | 001001000000100 |
| 236 | 001000100000100 |
| 239 | 001000010000100 |
| 243 | 001000001000100 |
| 247 | 001001001000100 |
| 248 | 001000000100100 |
| 252 | 001001000100100 |
| 254 | 001000100100100 |

FIG. 11B

TABLE F (39 Codes)

| Source Code (decimal value) | MSB Conversion Code LSB |
|---|---|
| 1 | 0001001000000010 |
| 3 | 0000100100000010 |
| 5 | 0000010010000010 |
| 9 | 0000001001000010 |
| 13 | 0001000000000010 |
| 14 | 0000000100100010 |
| 18 | 0001000100100010 |
| 20 | 0000100000000010 |
| 31 | 0000010000000010 |
| 38 | 0001001001000010 |
| 47 | 0000001000000010 |
| 51 | 0001000001000010 |
| 52 | 0000000000010010 |
| 56 | 0001001000010010 |
| 58 | 0000100100010010 |
| 61 | 0000010000010010 |
| 65 | 0000001000010010 |
| 69 | 0001000000010010 |
| 71 | 0000000100000010 |
| 75 | 0001000100000010 |
| 77 | 0000100000010010 |
| 106 | 0000000010000010 |
| 110 | 0001000010000010 |
| 112 | 0000100010000010 |
| 157 | 0000000000100010 |
| 163 | 0000100000100010 |
| 166 | 0000010000100010 |
| 178 | 0010010000000010 |
| 180 | 0010001000000010 |
| 183 | 0010000100000010 |
| 187 | 0010000010000010 |
| 191 | 0010010010000010 |
| 192 | 0010000000100010 |
| 196 | 0010010000100010 |
| 198 | 0010001001000010 |
| 200 | 0010000000010010 |
| 204 | 0010010000010010 |
| 206 | 0010001000010010 |
| 209 | 0010000100010010 |

FIG. 12

CODE CONVERSION AND DEMODULATION APPARATUS, A METHOD THEREOF, AND A RECORDING MEDIUM

BACKGROUND OF THE INVENTION

1. Field of the Invention

The present invention relates to a code conversion and demodulation apparatus which is used for recording, reproducing, and transmitting digital data and which is, for example, effective to record and reproduce information with respect to an optical disc The present invention also relates to a method thereof, and a recording medium for use in the apparatus and method.

2. Description of the Related Art

In the field of recording/transmission of digital data, various band elimination methods have been used in order to eliminate a band of a signal in the high frequency side, or in order to ensure that a band of a signal is eliminated in the high frequency side without problems. Included among those known methods, the bond elimination base band modulation method is related to the present invention.

In base band modulation, source data is divided into data pieces, each consisting of m bits, which are converted into conversion codes, each consisting of n bits, such that n satisfies a relation of m<n. In this case, the recording/transmission time width of m bits of source data is equal to the recording/transmission time width of n bits of a conversion code. Therefore, the bit rate of a conversion code is higher than the bit rate of source data. Thus, the bit rate of a conversion code is as n/m times as high as the bit rate of source data.

This conversion code is arranged such that the number of bits 0 inserted between a bit 1 and the next bit 1 is equal to a predetermined number of d or more, both in any one conversion code and in any consecutive code sequence. The polarity of a binary recording/transmission signal, which is called a channel signal hereinafter, is inverted at the position of the bit 1 in a conversion code sequence, and therefore, the minimum time in which one same polarity is maintained is (d+1) times as long as 1-bit distance of a conversion code sequence.

For example, in case of EFM modulation used in a compact disc, equations of m=8, n=1, and d=2 are satisfied and 8 bits of source data are converted into a conversion code of 17 bits. Therefore, the bit rate of a conversion code sequence is 17/8 times as high as the bit rate of source data. Further, the minimum time interval between inverting in the channel signal is (8/17)×3 times as long as that of source data, and power density of a channel signal is more concentrated on the frequency domain, so that the band width is narrowed.

In case of EFM modulation used in the compact disc as described above, a source data of 8 bits is converted into a conversion code of 17 bits.

At first, $2^8$=256 sorts of 8-bit source data are respectively converted into corresponding 256 sorts of predetermined 14-bit codes. These 14-bit codes are of those 256 sorts chosen by removing 21 sorts of codes from 277 sorts of 14-bit codes each of which has two or more bits of 0 between a bit 1 and another bit 1.

A 17-bit conversion code is obtained by adding 3 bits to a 14-bit code, and the 3 bits to be added are chosen suitably from various demands. The 17-bit conversion codes are therefore more than 256 sorts. However, 14-bit code portions are of 256 sorts each of which corresponds one-to-one to a source data. In addition, even when codes of 1 appear continuously at an end portion of 14 bits which must be included in a 14-bit code, a suitable 3 bits are added between the end portion and an adjacent code, and, therefore, it is possible to avoid a situation in which the number of bits of 0 inserted between a bit 1 and another bit 1 is equal to or less than 1, in a conversion code sequence of 17 bits.

If the 3 bits to be added in EFM modulation are changed to 2 bits, it is possible to obtain a method of converting a source data of 8 bits into a conversion code of 16 bits, and, therefore, a recording/transmission signal is obtained in which the power density is more concentrated at a low frequency band, i.e., the minimum time interval between inverting in the channel signal is (8/16)×3 times as long as that of source data. By this method, it is possible to avoid a situation where the number of bits of 0 inserted between a bit 1 and the next bit 1 in a conversion code sequence of 16 bits, which is called a run length, is 1 or less, by adding 2 bits as described above.

However, the above methods cannot be adapted to realize a method in which the minimum time interval between inverting a channel signal is (8/15)×3 times as long as that of source data with use of a method of converting a source data of 8 bits into a conversion code of 15 bits. This is because there is no way of avoiding a situation where the number of bits 0 inserted between a bit 1 and another bit 1 is 1 or less in a conversion code sequence of 15 bits, when a code ending with 1 is followed by a code starting with 1.

SUMMARY OF THE INVENTION

Therefore, the present invention has an object of providing an apparatus, a method, and a recording medium which achieve code conversion and demodulation as a reverse conversion thereof, in which source data of m bits is directly converted into a conversion code of n (>m) bits with ease whereby a source data of m bits is converted into a conversion code of n bits, without use of a method in which the source data is first converted into an intermediate code of q bits (in which q is smaller than n) and (n-q) bits are added to the intermediate code, as in a conventional method.

In order to achieve the above object, the present invention provides a code conversion apparatus comprising: first conversion means (A, B) for converting all $2^m$ sorts of source data, each consisting of m bits, into $2^m$ sorts of first conversion codes, which are predetermined in correspondence with the source data, which are different from each other, and each of which consists of n bits; second conversion means (C, D) for selecting one or more codes which are different from each other from all the $2^m$ sorts of source data to predetermine a plurality of sorts of codes which belong to each of first to k-th groups where k is an integer of 2 or more, and for converting source data belonging to the first to k-th groups into second conversion codes each consisting of n bits, such that the source data belonging to the first to k-th groups are all different from the first conversion codes; and third to (k+1)-th conversion means (E, F) for converting source data belonging to the second to k-th groups, which are subsequently converted after conversion of source data belonging to the first group by the second conversion means, into third to (k+1) conversion codes predetermined so as to include conversion codes having the same contents as the first conversion codes, characterized in that conversion is performed so as to satisfy a limitation condition that the run length in a bit sequence of conversion codes sequentially outputed from the conversion means does not deviate from a range between predetermined minimum and maximum numbers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1A schematically shows a code conversion apparatus according to the present invention;

FIG. 1B schematically shows a decoding apparatus according to the present invention;

FIG. 5 is a view explaining combinations of input byte values which satisfy a particular relationships in at connecting portions of bytes when code conversion processing is performed;

FIG. 6 is a view also explaining combinations of input byte values which satisfy a particular relationships in at connecting portions of bytes when code conversion processing is performed;

FIGS. 7A, 7B, and 7C are views explaining the contents of a table A;

FIGS. 8A and 8B are views explaining the contents of a table B;

FIGS. 9A and 9B are views explaining the contents of a table C;

FIG. 10 is a view explaining the contents of a table D;

FIGS. 11A and 11B are views explaining the contents of a table E; and

FIG. 12 is a view explaining the contents of a table F.

DETAILED DESCRIPTION OF THE PREFERRED EMBODIMENTS

In the following, embodiments of the present invention will be explained with reference to the drawings.

Figure 2:
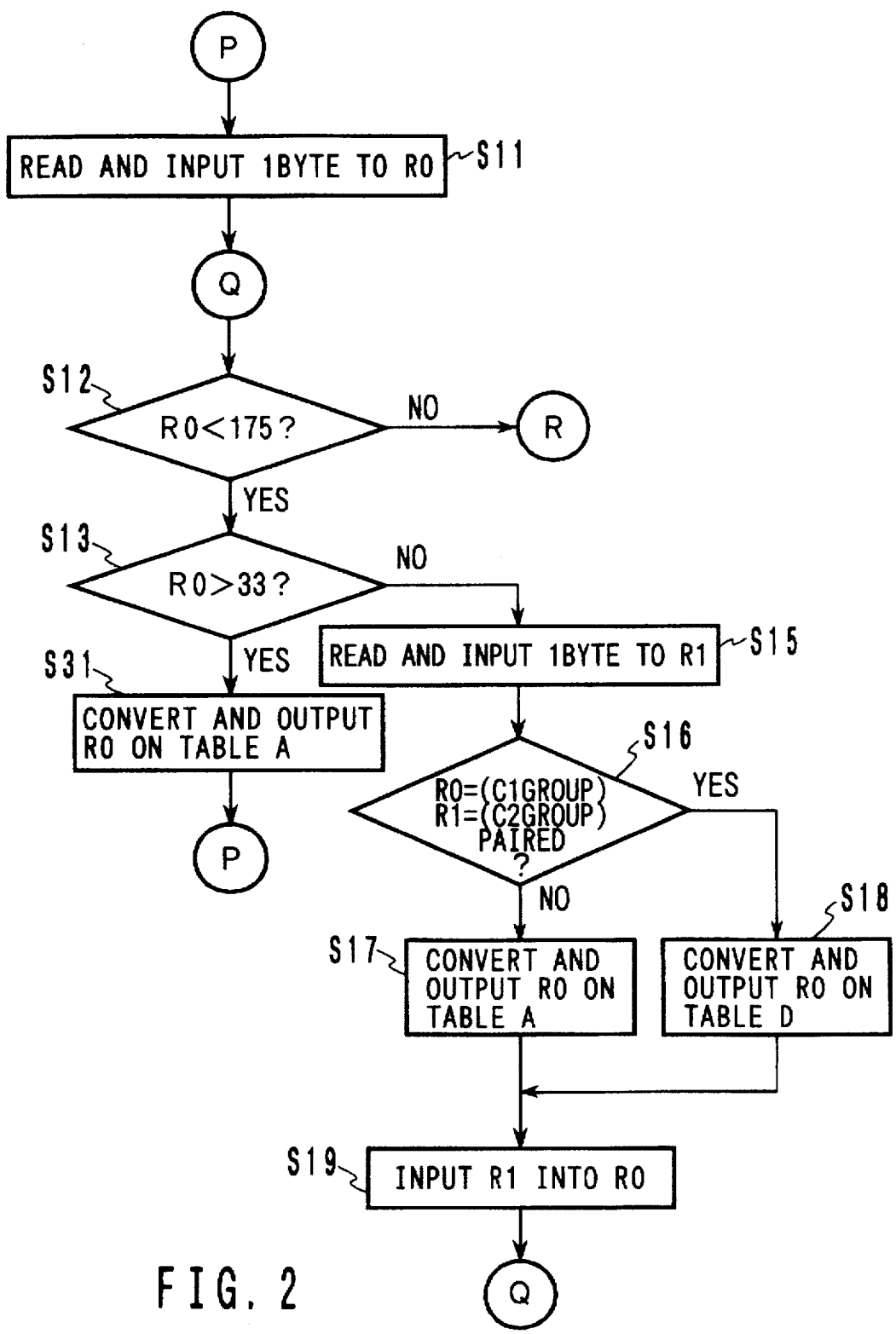
FIG. 2 is a flow chart showing procedures of code conversion processing.
Figure 3:
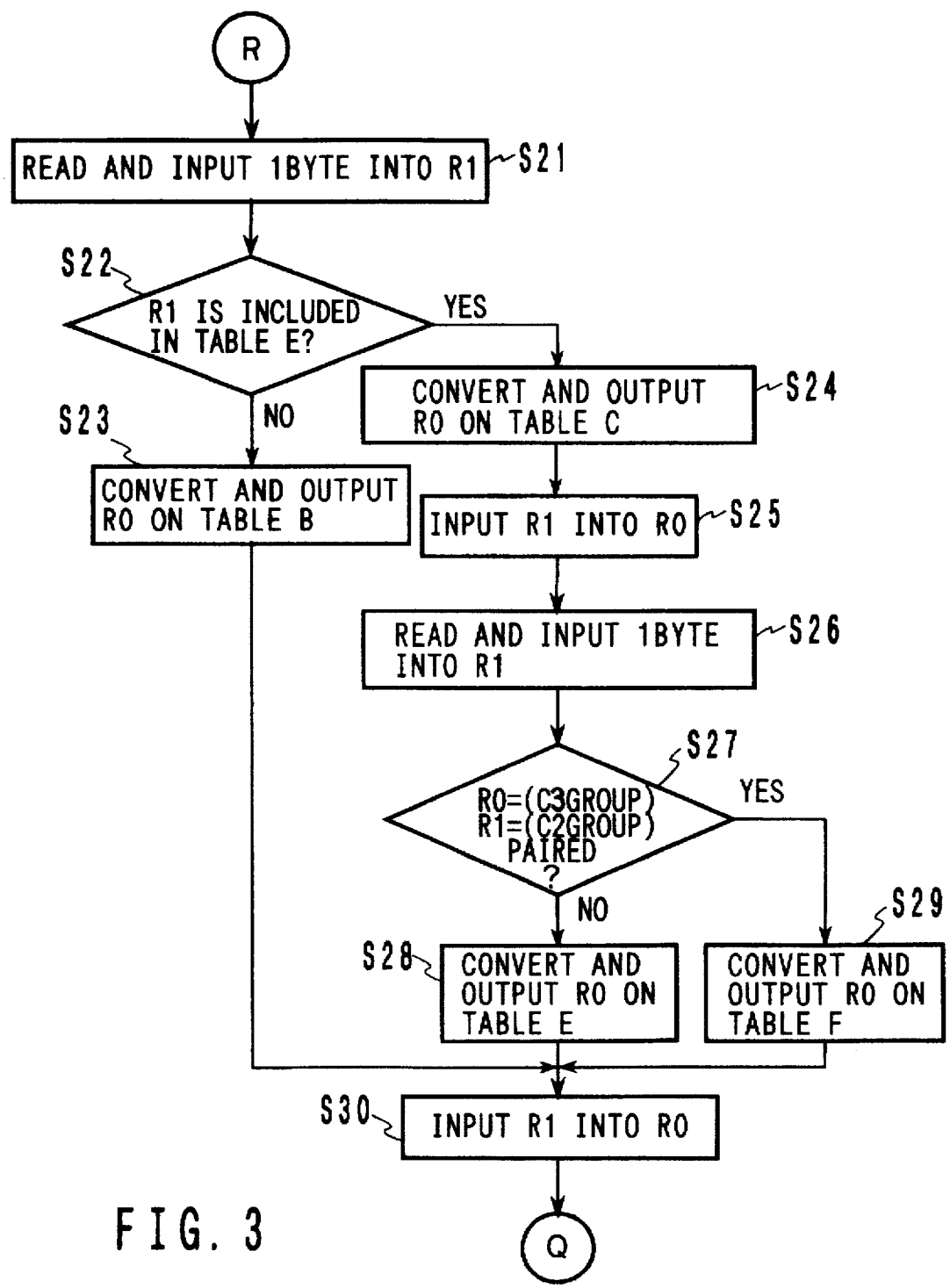
FIG. 3 is a flow chart also showing procedures of code conversion processing.
Figure 4:
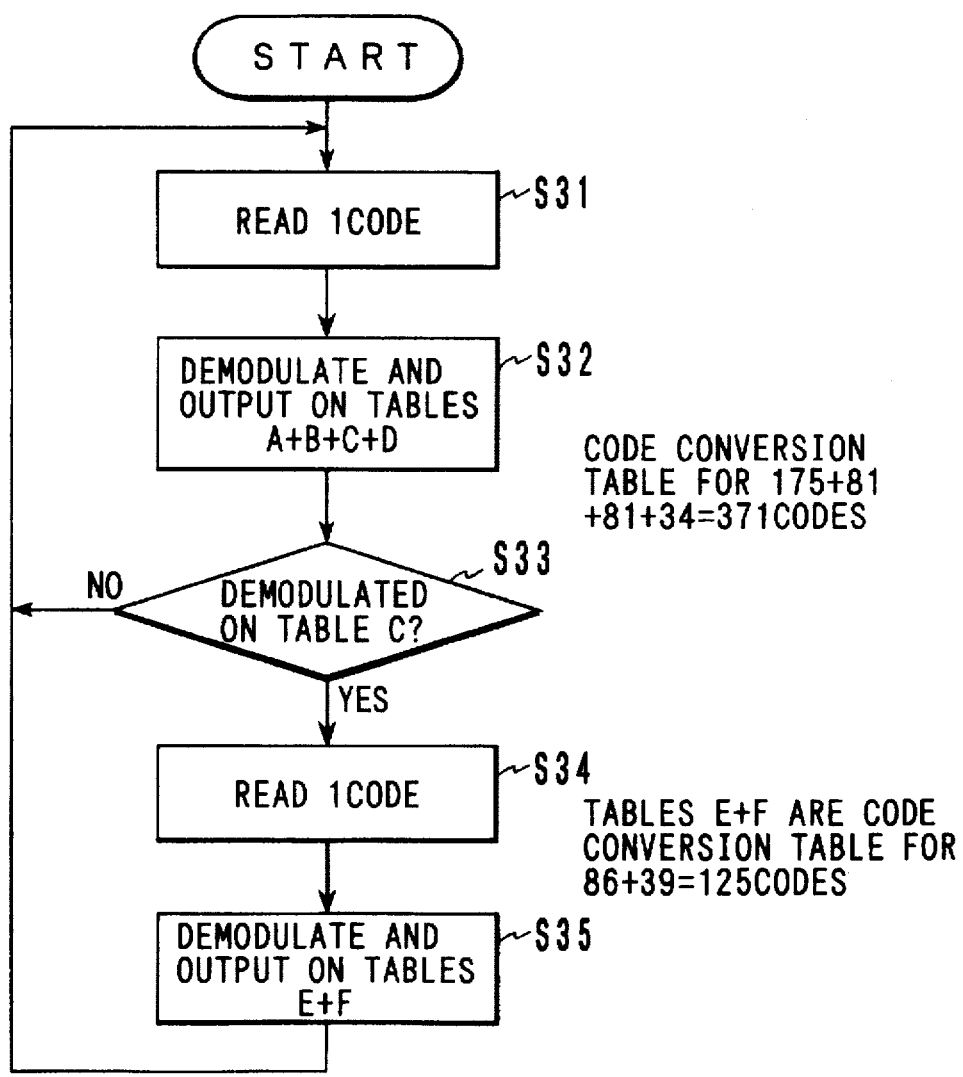
FIG. 4 is a flow chart showing procedures of decoding processing.

FIG. 1A shows a block diagram of a code conversion apparatus. FIG. 1B is a block diagram showing a decoding apparatus. In addition, FIGS. 2 and 3 shows a flow chart of an operation of a conversion apparatus in which 8 bits are converted into a code of 15 bits. Further, FIG. 4 shows a flow chart of an operation of a conversion apparatus in which a code of 15 bits is decoded into an original code of 8 bits. Further, FIGS. 5 and 6 show tables prepared for satisfying a limitation that the run length should not be out of a range defined by predetermined minimum and maximum numbers, at a joint of two consecutive codes.

At first, the contents of a conversion table which is significant in the present invention will be explained. This embodiment is adopted in 8/15 modulation in which a 8-bit digital code is converted into a 15-bit code in accordance with a particular rule, and in a modulation code sequence, the embodiment realizes a modulation code sequence in which at least two bits of 0 existing between a bit 1 and another bit 1, so that the minimum distance Tmin in which one same polarity is maintained in data after NRZI is $[(8/15) \times 3]T = 1.6T$. (where T is a duration of data bit before modulation), and the detection window width TW is $(8/15)T$=about 0.53T. Hence, an improvement in recording density of an optical disc is expected.

As a table for converting a source data of 8 bits into a modulation code of 15 bits, six sorts of tables A to F are prepared. In the following, each of those tables will be explained.

TABLE A

The table A includes 175 sorts of 15-bit codes decided by removing the following 14 sorts of codes from 189 sorts of 15-bit codes each having last two figures of "...00" (i.e., two figures at the right end are 00). On this table A, 8-bit source data equivalent to 0 to 174 expressed in decimal notation.

| | | |
|---|---|---|
| 00000 | 00000 | 00000 |
| 10000 | 00000 | 00000 |
| 01000 | 00000 | 00000 |
| 00100 | 00000 | 00000 |
| 00000 | 10000 | 00000 |
| 00000 | 00100 | 00000 |
| 00000 | 00010 | 00000 |
| 00000 | 00010 | 01000 |
| 00000 | 00010 | 00100 |
| 00000 | 00001 | 00000 |
| 00000 | 00001 | 00100 |
| 00000 | 00000 | 10000 |
| 00000 | 00000 | 01000 |
| 00000 | 00000 | 00100 |

All the codes of the table A are shown in FIGS. 7A, 7B, and 7C.

Among the output codes of the table A, the greatest number of consecutive 0, i.e., the maximum run length in the own code is 11 as apparent from the code of "10000 00000 00100".

In addition, the right end run length ranges from 2 at the smallest to 11 at the greatest, while the left end run length ranges from 0 at the smallest to 7 at the greatest.

In addition, there are 59 sorts of codes each of which has 1 at the top end.

TABLE B

The table B includes 81 sorts of 15-bit codes (in each of which two right end bits are 10) decided by removing the following 7 sorts of codes from 88 sorts of 15-bit codes which are expressed as "...0010". On the table B, 8-bit source data equivalent to 175 to 255 expressed in decimal notation are converted.

| | | |
|---|---|---|
| 00000 | 00000 | 00010 |
| 10000 | 00000 | 00010 |
| 00000 | 00100 | 00010 |
| 00000 | 00100 | 10010 |
| 00000 | 00010 | 00010 |
| 00000 | 00001 | 00010 |
| 00000 | 00000 | 10010 |

All the codes of the Table B are shown in FIGS. 8A and 8B.

In output codes of the table B, the maximum run length in the own code is 11 as apparent from "01000 00 00010".

In addition, the right end run length is 1, while the left end run length ranges from 0 at the smallest to 6 at the largest.

In addition, the table B includes 27 sorts of codes each having a top end of 1.

TABLES C AND D

As for the tables C and D, at first, 115 sorts of 15-bit codes are prepared by removing the following 14 sorts of codes from 129 sorts of 15-bit codes (each of which includes bits of "...001".

| | | |
|---|---|---|
| 00000 | 00000 | 00001 |
| 00000 | 00001 | 00001 |
| 00000 | 00010 | 00001 |
| 00000 | 00100 | 00001 |
| 10000 | 00000 | 00001 |
| 00000 | 00000 | 01001 |
| 00000 | 00010 | 01001 |
| 00000 | 00100 | 01001 |
| 00000 | 10010 | 01001 |
| 00100 | 10000 | 01001 |
| 01001 | 00000 | 01001 |
| 10010 | 00000 | 01001 |
| 00000 | 00000 | 10001 |
| 00000 | 00100 | 10001 |

In these 115 sorts of 15-bit codes, the maximum run in the own code is 12 as apparent from "01000 00000 00001".

The right end run length is 0, while the left end run length ranges from 0 at the smallest to 6 at the greatest.

The tables C and D are arranged as follows with use of the codes as described above.

TABLE C

The table C includes such 81 sorts of codes among the above 115 sorts of codes in which the right end bits are expressed as "...0001" and in which the left end run length is equal to that of codes of the table B.

The table C is used to convert 8-bit source data equivalent to 175 to 225 expressed in decimal notation, and all the conversion outputs of this table include four right end bits of 0001. All the codes of this table C are shown in FIGS. 9A and 9B.

TABLE D

The table D includes such 34 sorts of codes among the above 115 sorts of codes in which the right end bits are expressed as "...001001" and in which the left end run length is equal to that of codes of the table A.

The table D is used to convert 8-bit source data equivalent to 0 to 33 which will have six right end bits of "0" when converted by the table A, and all of the conversion outputs include six right end bits expressed as "001001". All the codes of this table D are shown in FIG. 10.

TABLE E

The table E includes 86 sorts of 15-bit codes defined by removing the following two sorts of codes from 88 sorts of 15-bit codes in which ends are expressed as "00...00".

| | | |
|---|---|---|
| 00000 | 00000 | 00000 |
| 00100 | 00000 | 00000 |

All the codes of the table E are shown in FIGS. 11A and 11B.

The maximum run length in the own code of the output codes of the table E is 9 as expressed in "00100 00000 00100".

In addition, the right end run length ranges from 2 at the smallest to 11 at the greatest, while the left end run length ranges from 2 at the smallest to 12 at the greatest.

TABLE F

The table F includes codes defined by changing 39 sorts of codes among 86 sorts of output codes of the table E to codes described as "00...0010".

In the output codes of the table F, the maximum run length in the own code is 10 as is expressed as "00000 00000 10010".

The right end run length is 1, while the left end run length ranges from 2 at the smallest to 10 at the greatest. Codes of the table F are shown in FIG. 12.

The contents and sorts of 15-bit codes of the tables A to F described above will be summarized as follows.

Table A includes 175 sorts of codes (having a code end expressed as...00)

Table B includes 81 sorts of codes (having a code end expressed as ...0010)

Table C includes 81 sorts of codes (having a code end expressed as ...0001)

Table D includes 34 sorts of codes (having a code end expressed as ...001001)

Table E includes 86 sorts of codes (having a code top expressed as 00... and a code end expressed as ...00)

Table F includes 39 sorts of codes (having a code top expressed as 00... and a code end expressed as ...0010)

Mutual relationships between 15-bit codes in the tables described above will be summarized as follows.

Any codes of the tables A, B, and C do not overlap each other.

Any codes of the tables C and D do not exist in the other tables.

The left end run length of the table C is equal to the left end run length of the table B.

The left end run length of the table D is equal to the left end run length of the table A.

76 sorts of codes among 86 sorts of codes of the table E exist in the table A.

34 sorts of codes among 39 sorts of codes of the table F exist in the table B.

The left end run length of the table F is equal to the left end run length of the table E.

In the above explanation of the tables, the contents of only the conversion codes corresponding to the source data have been described. In the following, explanation will be made to the design method as to how the source data are assigned to respective tables.

(1) Source data 0 to 174 (175 sorts of codes)

These codes are assigned to the table A.

34 sorts of source data (0 to 33) of the table A whose right end run is 6 or more are also assigned to the table D.

59 sorts of source data of the table A whose top bit is 1 are also assigned to 59 sorts of codes among the 86 sorts of codes of the table E.

(2) Source data 175 to 255 (81 sorts of codes)

These codes are assigned to both of the tables B and C.

27 sorts of source data whose top bit is 1 are also assigned to 27 sorts of codes among 86 sorts of codes of the table E.

(3) Partial substitutable codes of table E 39 sorts of source data of the table E whose right end run is 4 or more are also assigned to the table F.

MODULATION ALGORITHM: BASIC

When tables are prepared on the design conditions as described above, conversion of inputted source data is performed in accordance with the following algorithms.

(1) Source data 0 to 174

Perfect 1-byte conversion is performed, including cases in which the conversion table for a current source data is decided by a next source data.

(1a) When any of 141 sorts of source data except for 34 sorts of codes assigned to the table D is inputted, conversion is performed on the table A regardless of a next source data.

(1b) When any of 34 sorts of source data assigned to the table D is inputted, conversion is performed on the table D in place of the table A if a run length is 13 or more at a connecting portion between a 15-bit code obtained by converting the inputted data on the table A and a 15-bit code obtained by converting a next inputted source data of a second byte on the table A or B, while conversion is performed the run length is not 13 or more.

In other words, any of the source data of 0 to 174 is basically converted on the table A. However, when a source data is inputted and 13 or more "0" continues at a connecting portion where a next source data is converted on the table A or B, conversion is performed on the table D. This situation occurs when a current source data belongs to a group C1 while a next source data belongs to a group C2.

(2) Source data 175 to 255

(2a) When a next data is one of 171 sorts of source data which will have a top bit of 0 after being converted on the table A or table B, a current source data is subjected to perfect 1-byte conversion on the table B.

(2b) When a next source data will have a top bit of 1 after being converted on the table A or B, perfect 2-byte completion conversion is performed in the following manner.

At first, any one of source data 177 to 255 as a first code is converted on the table C in place of the table B and is thus fixed.

In the next, a source data of a second byte which is one of 86 sorts of data is converted as follows, with use of the table E or F.

With respect to 17 sorts of source data which will have a right end run length of 6 or more after being converted into a 15-bit code on the table E, the following processing is carried out. Specifically, when a run length is 13 or more between a 15-bit code obtained by converting a source data of a second byte on the table E and a 15-bit code obtained by converting a source of a third byte on the table A or B (when a current source data belongs to a group C3 and a next source data belongs to a group C2, in FIG. 6), conversion is performed on the table F in place of the table E. Otherwise, conversion is performed on the table E, and the second byte is completed.

The above description concerning source data of 177 to 255 will be summarized as follows. A first source data is basically converted on the table B. However, when a second source data is one of 86 sorts of source data which will have a left end bit of "1" after being converted on the table A or B, source data of a second byte, the first source data is converted on the table C.

In this case, a second source data is converted on the table E or F. In other words, whenever conversion is performed with use of the table C, next conversion is performed with use of the table E or F.

Whether conversion is performed with use of the table E or F is decided depending on the contents of a third source data. Basically, conversion is performed on the table E. However, when 13 or more bits run length at a connecting portion between a 15-bit code obtained by converting a third source data on the table A or B and a 15-bit code obtained by converting a second source data on the table E, the second source data is converted on the table F.

MODULATION ALGORITHM: OPTION

With respect to source data 0 to 174, the following processing may be performed.

In the modulation algorithm described above, when a run length is 13 or more at a connecting portion between a 15-bit code obtained by converting a current source data included in 34 sorts assigned to the table D, on the table A, and a 15-bit code obtained by converting a next source data on the table A or B, the current source data is converted on the table D. Otherwise, the current source data is converted on the table A.

Further, in this case, if the run length is 12 or less and 2 or more, it is possible to select that one of codes converted on the table A or D which has a smaller direct current component of a modulation signal.

With respect to source data 175 to 255, the following processing may be performed.

In the modulation algorithm described above, which of the tables E and F is used to convert a second source data is decided depending on the contents of a third source data. Basically, a second source data is converted on the table E. When 13 or more bits of "0" continue at a connecting portion between a 15-bit code obtained by converting a third source data on the table A or B and a 15-bit code obtained by converting a second source data on the table E, the second source data is converted on the table F.

Further, in this case, at the connecting portion, if the run is 12 or less and 2 or more, it is possible to select that one of codes converted on the table E or F that has a smaller direct current component of a modulation signal.

DEMODULATION ALGORITHM

In the next, explanation will be made of an algorithm which is used to decode a 15-bit code modulated with use of tables A to F as described above, into an original source data.

Decoding is treated as complete conversion of 1 byte or 2 bytes.

An inputed 15-bit code is decoded on one of tables A, B, C, and D. 15-bits codes of the tables A, B, C, and D do not overlap each other, and are therefore properly converted univocally.

When a current inputed code is decoded on the table C, a next inputed code is decoded on the table E or F.

As described above, modulation of a 8-bit source data into a 15-bit code and decoding of a 15-bit code into a 8-bit data can be performed at one action. Specifically, when a source data of m bits is converted into a conversion code of n bits, it is not necessary to adopt a complicated method as in a conventional method, in which a source data of m bits is converted an intermediate code of q bits where q is smaller than n and (n-q) bits are then applied to the intermediate code, but it is possible to directly convert a source data into a conversion code of n (>m) bits with ease, and to directly perform the reverse conversion.

The algorithm as described above is 8/15-PLL(2, 12) modulation and demodulation for source data 1-byte or 2-byte complete conversion.

Although the modulation must be monitored with a width of 3 bytes at the greatest, a modulation result is completed within a width of 2 bytes. Also, demodulation is simple, and it is only necessary to repeat reference to conversion tables and demodulation into 1 byte, for every one modulation code, as well as simultaneous determination of a conversion table to be used for demodulating a next modulation code. Conversion tables between 8-bit data and 15-bit codes to be referred to total 6 sorts including 496 patterns (the contents of which are basically 2 sorts including 256 patterns and 4 sorts of substitute including 240 patterns).

Next, conversion and decoding operations according to the present invention will be explained below with use of specific source data.

FIG. 1A shows a modulation block, and flow charts corresponding thereto are shown in FIGS. 2 and 3. FIG. 1B shows a decoding block diagram, and a flow chart corresponding thereto is shown in FIG. 4. The following explanation will be made with reference to FIGS. 1A, 2, and 3.

An input end IN is supplied with 8-bit data, which is sent to a 8-bit register R0. Here, it is supposed that original data byte values are sequentially inputed for every 8 bits in an order of 200 to 178 to 100. At the first, first 1 byte is stored into a register R0 (in a step S11). Then, a control unit U1 determines the value in the register R0. In this example, the value of R0 (=200) is greater than 175 (in a step S12), and therefore, the control unit U1 goes to a step S21 shown in FIG. 3, thereby to store a next byte into a register R1. Then, the control unit U1 determines the value in the R1. The value in the register R1 is 178 in this case, and exists in the table E.

Therefore, the control unit U1 converts a value of 200 in the register R0 into a 15-bit code with use of the table C, and outputs "100100001000001" (in a step S24).

In the next, the content of the register R1 is transferred to the register R0 (in a step S25). The value in the register R0 becomes 178. Subsequently, a value of 100 as a next 1 byte is stored into the register R1. The value of 178 in the R0 belongs to a C3 group (shown in FIG. 6), but the value of 100 in the register R1 is not included in the corresponding C2 group (in a step S27).

Therefore, in this case, the value 178 is converted into a 15-bit code on the table E (in a step S28), and "001001000000000" is outputed. Subsequently, the content of the register R1 is transferred to the register R0. In this manner, the value of R0 becomes 100 (in a step S30). Thereafter, the control unit U1 determines this value, and subsequent steps including steps S12 and S13 shown in FIG. 2 are performed.

In the procedures as described above, an inputs of 200 to 178 of original data byte values for every 8 bits are converted into "100100001000001001001000000000".

Note that the routine of steps S13 to S15 in FIG. 2 means the following conversion processing. Specifically, when a source data of 0 to 174 is converted and when 13 or more bits of "0" continue at a connecting portion after a next source data is converted on the table A or B (13 or more bits of "0" may thus continue if a source data is one of 0 to 33), conversion is performed on the table D. Otherwise, the source data is converted on the table A. Since determination as to the above must be performed in the step S16, the determination is realized by preparing a table as shown in FIG. 5, in a determination section of the control unit U1.

In the next, explanation will be made to an operation of decoding 2 bytes of 15-bit codes as described above. FIG. 1B shows a basic block diagram, and FIG. 4 shows a processing procedure. Here, it is supposed that the code exemplified above is decoded. First 15 bits of the input code sequence 100100001000001001001000000000 are stored in the register R2. The code of the register R2 is decoded on a reverse table in which all the tables A to D are synthesized (in steps S31 and S32). Then, a value 200 of an original data byte is obtained as a decoding output. The control unit U2 determines whether or not the first input code of 15 bits is decoded on the reverse table of the table C (in a step S33). In this case, since the first input code of 15 bits is decoded on the reverse table of the table C, a next input code of 15 bits is subsequently stored into the register R2 and is decoded on the reverse table obtained by synthesizing the tables E and F (in steps S34 and S35). In this manner, a value 178 of an original data byte is obtained.

Meanwhile, by carefully discussing the conversion tables in the above example, the second code decode on the reverse table of the table E is decoded into 7 on the table A. Thus, different original codes can be converted into one same code on different tables, and therefore, secure conversion/decoding can be performed even when the number of codes for various limitation conditions are insufficient with respect to the number of codes actually required. This characterizes the present invention.

In the above description, the tables A to F have been explained as memories which store conversion codes. However, the tables A to F may be constituted by logic circuits or operation circuits which have the same data generation functions as the tables A to F.

As has been explained above, according to the present invention, when a source data of m bits is converted into a conversion code of n bits, the source data can be directly converted into a conversion code of n (>m) bits with ease, and the reverse conversion can also be performed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A code conversion apparatus characterized by comprising:

conversion means A for generating conversion codes corresponding to source data of 0 to 174 expressed in decimal notation, said conversion codes all being 15-bit codes each having two right end bits of 00;

conversion means B for generating conversion codes corresponding to source data of 175 to 255 expressed in decimal notation, said conversion codes all being 15-bit codes each having two right end bits of 10;

conversion means C for generating conversion codes corresponding to source data of 175 to 255 expressed in decimal notation, said conversion codes all being 15-bit codes each having right end bits of 0001 and said conversion codes including run length from a left end to a first bit 1 equal to those of the conversion means B;

conversion means D for generating conversion codes corresponding to those source data of 0 to 33 expressed in decimal notation, that are to be converted by the conversion means A and are to have six right end bits each consisting of 0 after being converted by the conversion means A, said conversion codes all being 15-bit codes having six right end bits expressed as 001001 and having run length from a left end to a first bit 1 equal to those of the conversion means A;

conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00;

conversion means F for generating conversion codes corresponding to those source data among the source data to be converted by the conversion means E, that will have four right end bits of 0000 and two left bits of 00 after being converted by the conversion means E, said conversion codes being 15-bit codes in which said four right end bits are changed to 0010;

means for performing conversion with use of the conversion means D in place of the conversion means A, when 13 or more 0's continue at a connecting portion between a conversion code obtained by converting any of the source data of 0 to 174 by the conversion means A and a next conversion code obtained by converting a next source data by the conversion means A or B;

means for performing conversion with use of the conversion means C in place of the conversion means B, on a current source data among the source data of 175 to 255, when a second source data consecutive to the current source data will have a left end bit of 1 after being converted by the conversion means A or B; and means for performing conversion with use of the conversion means F in place of the conversion means E, such that the second source data is basically converted by the conversion means E when conversion is performed with use of the conversion means C, while 13 or more 0's continue at a connecting portion between a conversion code obtained by converting the second source data and a conversion code obtained by converting a third source data consecutive to the second source data by the conversion means A or B.

2. A code conversion apparatus according to claim 1, wherein the conversion means A to F are conversion tables arranged so as to function as memories.

3. A code conversion apparatus according to claim 1, wherein 175 sorts of 15-bit codes are stored in the conversion means A, 81 sorts of 15-bit codes are stored in the conversion means B, 81 sorts of 15-bit codes are stored in the conversion means C, 34 sorts of 15-bit codes are stored in the conversion means D, 86 sorts of 15-bit codes are stored in the conversion means, and 39 sorts of 15-bit codes are stored in the conversion means F.

4. A code conversion apparatus comprising:

first conversion means for converting all $2^m$ sorts of source data each consisting of m bits into $2^m$ sorts of first conversion codes which are predetermined in correspondence with the source data, which are different from each other, and each of which consists of n bits;

second conversion means for selecting one or more codes which are different from each other, from all the $2^m$ sorts of source data, to predetermine a plurality of sorts of codes which belong to each of first to k-th groups where k is an integer of 2 or more, and for converting source data belonging to the first to k-th groups into second conversion codes each consisting of n bits, such that the source data belonging to the first to k-th groups are all different from the first conversion codes; and third to (k+1)-th conversion means for converting source data belonging to the second to k-th groups, which are subsequently converted after conversion of source data belonging to the first group by the second conversion means, into third to (k+1)-th conversion codes predetermined so as to include conversion codes having the same contents as the first conversion codes, wherein conversion is performed so as to satisfy a limitation condition that the run length in a bit sequence of conversion codes sequentially outputted from the conversion means does not deviate from a range between predetermined minimum and maximum numbers.

5. A code conversion apparatus according to claim 4, wherein m is 8, n is 15, and k is 2.

6. A code decoding apparatus comprising:

first decoding means for decoding conversion codes of more than $2^m$ sorts, each consisting of n bits, into all source data of $2^m$ sorts, each consisting of m bits, where m and n are integers which satisfy relations of m>1, n1, and m<n; and second to (k+1)-th decoding means for predetermining a plurality of conversion codes belonging to each of first to k-th groups from all the conversion codes of more than $2^m$ sorts, and for decoding a conversion code belonging to the first group into a source data by the first decoding means, and thereafter, decoding conversion codes belonging to the second to k-th groups into source data which are different from the case of the first decoding means and each of which consists of m bits, when conversion codes belonging to the first to k-th group are sequentially inputed in this order, wherein decoding is properly performed even when there are conversion codes each consisting of n bits and having the same content and corresponding to different source data, in order to satisfy a limitation condition that the run length in a bit sequence of conversion codes does not deviate from a range between predetermined minimum and maximum numbers.

7. A code decoding apparatus according to claim 6, wherein m is 8, n is 15, and k is 2.

8. A decoding apparatus for performing reverse conversion on 15-bit codes generated by performing code conversion with use of conversion means A for generating conversion codes corresponding to source data of 0 to 174 expressed in decimal notation, said conversion codes all being 15-bit codes each having two right end bits of 00, conversion means B for generating conversion codes corresponding to source data of 175 to 255 expressed in decimal notation, said conversion codes all being 15-bit codes each having two right end bits of 10, conversion means C for generating conversion codes corresponding to source data of 175 to 255 expressed in decimal notation, said conversion codes all being 15-bit codes each having four right end bits of 0001 and said conversion codes including run length from a left end to a first bit 1 which is equal to those of the conversion means B, conversion means D for generating conversion codes corresponding to those source data of 0 to 33 expressed in decimal notation, that are to be converted by the conversion means A and are to have six right end bits each consisting of 0 after being converted by the conversion means A, said conversion codes all being 15-bit codes having six right end bits expressed as 001001 and having run length from a left end to a first bit 1 equal to those of the conversion means A, conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00, and conversion means F for generating conversion codes corresponding to those source data among the source data to be converted by the conversion means E, that will have four right end bits of 0000 and two left bits of 00 after being converted by the conversion means E, said conversion codes being 15-bit codes in which said four right end bits are changed to 0010, said decoding apparatus comprising:

first decoding means for decoding an input 15-bit code by reverse conversion means of the conversion means A, B, C, or D; and second decoding means for decoding a next 15-bit code by synthetic reverse conversion means of the conversion means E or F, when the reverse conversion means of the conversion means C is used in the first decoding means.

9. A decoding apparatus according to claim 8, wherein the conversion means A, B, C, D, E, and F respectively store 175, 81, 81, 34, 86 and 39 sorts of 15-bit codes, and the first and second decoding means store reverse conversion codes corresponding to the 15-bit codes.

10. A code conversion method using:

conversion means A for generating conversion codes corresponding to source data of 0 to 174 expressed in decimal notation, said conversion codes all being 15-bit codes each having two right end bits of 00;

conversion means B for generating conversion codes corresponding to source data of 175 to 255 expressed in decimal notation, said conversion codes all being 15-bit codes each having two right end bits of 10;

conversion means C for generating conversion codes corresponding to source data of 175 to 255 expressed in decimal notation, said conversion codes all being 15-bit codes each having right end bits of 0001 and said conversion codes including run length from a left end to a first bit 1 which is equal to those of the conversion means B;

conversion means D for generating conversion codes corresponding to those source data of 0 to 33 expressed in decimal notation, that are to be converted by the conversion means A and are to have six right end bits each consisting of 0 after being converted by the conversion means A, said conversion codes all being 15-bit codes having six right end bits expressed as 001001 and having run length from a left end to a first bit 1 equal to those of the conversion means A;

conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00; and conversion means F for generating conversion codes corresponding to those source data to be converted by the conversion means E, that will have four right end bits of 0000 and two left bits of 00 after being converted by the conversion means E, said conversion codes being 15-bit codes in which said four right end bits are changed to 0010, said code conversion method comprising the steps of:

performing conversion with use of the conversion means D in place of the conversion means A, when 13 or more 0's continue at a connecting portion between a conversion code obtained by converting any of the source data of 0 to 174 by the conversion means A and a next source data by the conversion means A or B, performing conversion with use of the conversion means C in place of the conversion means B, on a current source data among the source data of 175 to 225, when a second source data consecutive to the current source data will have a left end bit of 1 after being converted by the conversion means A or B, and performing conversion with use of the conversion means F in place of the conversion means E, such that the second source data is basically converted by the conversion means E when conversion is performed with use of the conversion means C, while 13 or more 0's continue at a connecting portion between a conversion code obtained by converting the second source data and a conversion code obtained by converting a third source data consecutive to the second source data by the conversion means A or B.

11. A decoding method for performing reverse conversion on 15-bit codes generated by performing code conversion with use of conversion means A for generating conversion codes corresponding to source data of 0 to 174 expressed in decimal notation, said conversion codes all being 15-bit codes each having two right end bits of 00, conversion means B for generating conversion codes corresponding to source data of 175 to 255 expressed in decimal notation, said conversion codes all being 15-bit codes each having two right end bits of 10, conversion means C for generating conversion codes corresponding to source data of 175 to 255 expressed in decimal notation, said conversion codes all being 15-bit codes each having right end bits of 0001 and said conversion codes including run length from a left end to a first bit 1 which is equal to those of the conversion means B, conversion means D for generating conversion codes corresponding to those source data of 0 to 33 expressed in decimal notation, that are to be converted by the conversion means A and are to have six right end bits each consisting of 0 after being converted by the conversion means A, said conversion codes all being 15-bit codes having six right end bits expressed as 001001 and having run lengths from a left end to a first bit 1 equal to those of the conversion means A, conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00, and conversion means F for generating conversion codes corresponding to those source data among the source data to be converted by the conversion means E, that will have four right end bits of 0000 and two left bits of 00 after being converted by the conversion means E, said conversion codes being 15-bit codes in which said four right end bits are changed to 0010, wherein an input 15-bit code is converted by reverse conversion means of the conversion means A, B, C, or D, and that a next 15-bit code is decoded by synthetic conversion means of the conversion means E or F when the reverse conversion means of the conversion means C is used when decoding the 15-bit code.

12. A recording medium for recording, as information sources, 15-bit codes generated by performing code conversion with use of conversion means A for generating conversion codes corresponding to source data of 0 to 174 expressed in decimal notation, said conversion codes all being 15-bit codes each having two right end bits of 00, conversion means B for generating conversion codes corresponding to source data of 175 to 255 expressed in decimal notation, said conversion codes all being 15-bit codes each having two right end bits of 10, conversion means C for generating conversion codes corresponding to source data of 175 to 255 expressed in decimal notation, said conversion codes all being 15-bit codes each having right end bits of 0001 and said conversion codes including run lengths from a left end to a first bit 1 which are equal to those of the conversion means B, conversion means D for generating conversion codes corresponding to those source data of 0 to 33 expressed in decimal notation, that are to be converted by the conversion means A and are to have six right end bits all consisting of 0 after being converted by the conversion means A, said conversion codes all being 15-bit codes having six right end bits expressed as 001001 and having run length from a left end to a first bit 1 equal to those of the conversion means A, conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00, and conversion means F for generating conversion codes corresponding to those source data to be converted by the conversion means E, that will have four right end bits of 0000 and two left bits of 00 after being converted by the conversion means E, said conversion codes being 15-bit codes in which said four right end bits are changed to 0010.

13. A code conversion apparatus comprising:

conversion means A for generating conversion codes corresponding to source data of 0 to 174 expressed in decimal notation, said conversion codes all being 15-bit codes each having two right end bits of 00;

conversion means B for generating conversion codes corresponding to source data of 175 to 255 expressed in decimal notation, said conversion codes all being 15-bit codes each having two right end bits of 10;

conversion means C for generating conversion codes corresponding to source data of 175 to 255 expressed in decimal notation, said conversion codes all being 15-bit codes each having four right end bits of 0001 and said conversion codes including run lengths from a left end to a first bit 1 which are equal to those of the conversion means B;

conversion means D for generating conversion codes corresponding to those source data of 0 to 33 expressed in decimal notation, that are to be converted by the conversion means A and are to have six right end bits each consisting of 0 after being converted by the conversion means A, said conversion codes all being 15-bit codes having six right end bits expressed as 001001 and having run lengths from a left end to a first bit 1 equal to those of the conversion means A;

conversion means E for generating conversion codes corresponding to those source data of 0 to 255 expressed in decimal notation that will have a left end bit of 1 after being converted by the conversion means A or B, said conversion codes being 15-bit codes having left end 2 bits of 00 and right end 2 bits of 00;

conversion means F for generating conversion codes corresponding to those source data to be converted by the conversion means E, that will have four right end bits of 000 and two left bits of 00 after being converted by the conversion means E, said conversion codes being 15-bit codes in which said four right end bits are changed to 0010;

means for performing conversion with use of the conversion means D in place of the conversion means A, when 13 or more 0's continue at a connecting portion between a conversion code obtained by converting any of the source data of 0 to 174 by the conversion means A and a next conversion code obtained by converting a next source data by the conversion means A or B, and for selecting that one of conversion codes converted by the conversion means A and D whose modulation signal will have a smaller direct current component when 2 or more and 12 or less bits of 0 continue at the connecting portion;

means for performing conversion with use of the conversion means C in place of the conversion means B, on a current source data among the source data of 175 to 255, when a second source data consecutive to the current source data will have a left end bit of 1 after being converted by the conversion means A or B; and means for performing conversion with use of the conversion means F in place of the conversion means E, such that the second source data is basically converted by the conversion means E when conversion is performed with use of the conversion means C, while 13 or more 0's continue at a connecting portion between a conversion code obtained by converting the second source data and a conversion code obtained by converting a third source data consecutive to the second source data by the conversion means A or B, and for selecting that one of conversion codes converted by the conversion means E and F whose modulation signal will have a smaller direct current component when 2 or more and 12 or less bits of 0 continued at the connecting portion.

* * * * *

UNITED STATES PATENT AND TRADEMARK OFFICE
CERTIFICATE OF CORRECTION

PATENT NO. : 5,729,224
DATED : March 17, 1998
INVENTOR(S) : HIRAYAMA et al.

It is certified that error appears in the above-identified patent and that said Letters Patent is hereby corrected as shown below:

On the title page: Item

[73] Assignee: Kabushiki Kaisha Toshiba, Kanagawa-ken, Japan should read:

[73] Assignee: Kabushiki Kaisha Toshiba, Kawasaki-shi, Japan;
    Matsushita Electric Industrial Co., Ltd., Kadoma-shi, Japan Signed and Sealed this Fourteenth Day of September, 1999

*Attest:*

Q. TODD DICKINSON

*Attesting Officer*      *Acting Commissioner of Patents and Trademarks*